United States Patent
Pleskach et al.

(10) Patent No.: US 7,196,607 B2
(45) Date of Patent: Mar. 27, 2007

(54) EMBEDDED TOROIDAL TRANSFORMERS IN CERAMIC SUBSTRATES

(75) Inventors: Michael D. Pleskach, Orlando, FL (US); Andrew J. Thomson, Indialantic, FL (US)

(73) Assignee: Harris Corporation, Melbourne, FL (US)

(*) Notice: Subject to any disclaimer, the term of this patent is extended or adjusted under 35 U.S.C. 154(b) by 81 days.

(21) Appl. No.: 10/810,952

(22) Filed: Mar. 26, 2004

(65) Prior Publication Data

US 2005/0212642 A1 Sep. 29, 2005

(51) Int. Cl.
*H01F 5/00* (2006.01)
*H01F 27/28* (2006.01)

(52) U.S. Cl. ............... 336/200; 336/229; 336/223; 29/602.1

(58) Field of Classification Search ........... 336/200, 336/223, 232, 229; 29/602.1, 604–606
See application file for complete search history.

(56) References Cited

U.S. PATENT DOCUMENTS

| | | | |
|---|---|---|---|
| 3,581,243 A | 5/1971 | Alford | |
| 3,614,554 A | 10/1971 | Shield et al. | |
| 3,681,716 A | 8/1972 | Chiron et al. | |
| 4,626,816 A * | 12/1986 | Blumkin et al. | 336/192 |
| 4,638,271 A | 1/1987 | Jecko et al. | |
| 4,967,171 A | 10/1990 | Ban et al. | |
| 5,029,043 A * | 7/1991 | Kitahara et al. | 361/321.2 |
| 5,055,816 A * | 10/1991 | Altman et al. | 336/200 |
| 5,070,317 A | 12/1991 | Bhagat | |
| 5,714,112 A | 2/1998 | Hazeyama et al. | |
| 5,781,091 A | 7/1998 | Krone et al. | |
| 5,805,043 A * | 9/1998 | Bahl | 336/200 |
| 6,054,914 A | 4/2000 | Abel et al. | |
| 6,094,123 A | 7/2000 | Roy | |
| 6,148,500 A * | 11/2000 | Krone et al. | 29/602.1 |
| 6,198,374 B1 | 3/2001 | Abel | |
| 6,249,039 B1 | 6/2001 | Harvey et al. | |
| 6,292,084 B1 | 9/2001 | Choi et al. | |
| 6,303,971 B1 | 10/2001 | Rhee | |
| 6,445,271 B1 | 9/2002 | Johnson | |
| 6,498,557 B1 | 12/2002 | Johnson | |
| 6,535,098 B1 | 3/2003 | Yeo et al. | |
| 6,791,496 B1 * | 9/2004 | Killen et al. | 343/700 MS |
| 6,820,321 B1 * | 11/2004 | Harding | 29/602.1 |
| 6,847,282 B1 * | 1/2005 | Gomez et al. | 336/200 |

(Continued)

FOREIGN PATENT DOCUMENTS

EP 0 754 660 A1 1/1997

(Continued)

OTHER PUBLICATIONS

U.S. Appl. No. 10/657,054, filed Sep. 5, 2003, Pleskach et al.

(Continued)

*Primary Examiner*—Anh Mai
(74) *Attorney, Agent, or Firm*—Sacco & Associates, PA; Robert J. Sacco

(57) ABSTRACT

Method for forming a transformer (118) in a ceramic substrate. The method can include the steps of forming at least one conductive coil (119a, 119b) comprising a plurality of turns about an unfired ceramic toroidal core region (120a, 120b) defined within an unfired ceramic substrate (100). The method can also include the step of co-firing the unfired ceramic toroidal core region (120a, 120b), the unfired ceramic substrate (100), and the conductive coil (119a, 119b) to form an integral ceramic substrate structure with the conductive coil at least partially embedded therein.

23 Claims, 9 Drawing Sheets

U.S. PATENT DOCUMENTS

| | | | |
|---|---|---|---|
| 6,906,682 B1 * | 6/2005 | Alexopoulos et al. | 343/895 |
| 6,914,513 B1 * | 7/2005 | Wahlers et al. | 336/233 |
| 2004/0124961 A1 * | 7/2004 | Aoyagi | 336/200 |

FOREIGN PATENT DOCUMENTS

| | | |
|---|---|---|
| EP | 1 089 374 A2 | 4/2001 |
| EP | 1 108 533 | 6/2001 |
| JP | 56-123102 | 9/1981 |
| JP | 05-211402 | 8/1983 |
| JP | 07-015218 | 1/1995 |
| JP | 08-154006 | 6/1996 |
| JP | 08 307117 | 11/1996 |
| JP | 10/190321 | 7/1998 |
| JP | 2000307362 | 11/2000 |
| JP | 2001267129 A * | 9/2001 |
| WO | WO 01-01453 A2 | 1/2001 |

OTHER PUBLICATIONS

Itoh, T.; et al: "Metamaterials Structures, Phenomena and Applications" IEEE Transactions on Microwave Theory and Techniques; Apr. 2005; [Online] Retrieved from the Internet: URL:www.mtt.org/publications/Transactions/CFP_Metamaterials.pdf>.

Kiziltas, G.; et al: "Metamaterial design via the density method" IEEE Antennas and Propagation Society Int'l Symposium 2002, vol. 1, Jun. 16, 2002 pp. 748-751, Piscataway.

Salahun, E.; et al: "Ferromagnetic composite-based and magnetically-tunable microwave devices" IEEE MTT-S Microwave Symposium Digest, vol. 2, Jun. 2, 2002 pp. 1185-1188.

* cited by examiner

EMBEDDED TOROIDAL TRANSFORMERS IN CERAMIC SUBSTRATES

BACKGROUND OF THE INVENTION

1. Statement of the Technical Field

The inventive arrangements relate generally to transformers and more particularly to toroidal transformers.

2. Description of the Related Art

Transformers are passive electrical devices that transform alternating or intermittent electric energy in one circuit into energy of a similar type in another circuit, commonly with altered values of voltage and current. The ratio of input voltage to output voltage in a particular transformer device is generally determined by the number of turns in the primary coil as compared to the secondary coil. There is a small loss associated with this transformation that is made up of two components. The first source of loss is referred to as "core" loss (also called no-load loss). This type of loss results from the magnetizing and de-magnetizing of the core during normal operation of the transformer. The second loss component is called coil or load loss, because the efficiency losses occur in the primary and secondary coils of the transformer. Coil loss is the result of resistance that exists in the winding materials.

For a particular transformer having a particular turns ratio it is well known that an air core will result in lower efficiency because it has a permeability of 1.0 (the terms permeability and permittivity as used herein should be understood to mean relative permeability and relative permittivity, respectively). Other types of dielectric core materials will behave similarly if they also have a relative permeability close to 1.0. Conversely, ferromagnetic materials, which have higher permeability values, are often used as core materials to increase the inductance achieved for a particular coil configuration.

Transformers can be wound around cores having a variety of shapes ranging from simple cylindrical rods to donut-shaped toroids. Toroids are advantageous in this regard since they substantially contain the magnetic field produced by the transformer within the core region so as to limit RF leakage and avoid coupling and interference with other nearby components.

In miniature RF circuitry, transformers tend to be implemented as surface mount devices or coupled planar spirals formed directly on the surface of an RF substrate. However, planar spiral transformers suffer from a serious drawback in that they do not substantially contain the magnetic field that they produce. In contrast, torroidal transformers can effectively contain the magnetic field of the transformer. However, implementation of toroids in miniaturized RF circuitry has presented practical difficulties that have typically required them to be implemented as surface mount components.

Regardless of the exact design of a surface mount component, the circuit board real estate required for such components has become a significant factor contributing to the overall size of RF systems. In fact, passive surface mount devices can typically comprise 80% of a substrate surface area. This causes the surface area of the substrate to be large, while the thickness remains relatively small. This is not an effective use of board real estate.

U.S. Pat. No. 5,781,091 to Krone, et al discloses an electronic inductive device and method for manufacturing same in a rigid copper clad epoxy laminate. The process involves drilling a series of spaced holes in an epoxy laminate, etching the copper cladding entirely off the board, positioning epoxy laminate over a second laminate, positioning a toroidal ferromagnetic core within each of the spaced holes, and filling the remainder of each hole with a fiber-filled epoxy. This technique involves numerous additional processing steps that are not normally part of the conventional steps involved in forming a conventional epoxy PWB. These additional steps naturally involve further expense. Further, such techniques are poorly suited for use with other types of substrates, such as ceramic types described below.

Glass ceramic substrates calcined at 850~1,000 C are commonly referred to as low-temperature co-fired ceramics (LTCC). This class of materials have a number of advantages that make them especially useful as substrates for RF systems. For example, low temperature 951 co-fire Green Tape™ from Dupont® is Au and Ag compatible, and it has a thermal coefficient of expansion (TCE) and relative strength that are suitable for many applications. Other LTCC ceramic tape products are available from Electro-Science Laboratories, Inc. of 416 East Church Road, King of Prussia, Pa. 19406-2625, USA. Manufacturers of LTCC products typically also offer metal pastes compatible with their LTCC products for defining metal traces and vias.

The process flow for traditional LTCC processing includes (1) cutting the green (unfired) ceramic tape from roll, (2) removing the backing from the green tape, (3) punching holes for electrical vias, (3) filling via holes with conductor paste and screening print patterned conductors, (4) stacking, aligning and laminating individual tape layers, (5) firing the stack to sinter powders and densify, and (6) sawing the fired ceramic into individual substrates.

LTCC processing requires that materials that are co-fired are compatible chemically and with regard to thermal coefficient of expansion (CTE). Typically, the range of commercially available LTCC materials has been fairly limited. For example; LTCC materials have been commercially available in only a limited range of permittivity values and have not generally included materials with permeability values greater than one. Recently, however, developments in metamaterials have begun to expand the possible range of materials that can be used with LTCC. Further, new high-permeability ceramic tape materials that are compatible with standard LTCC processes have now become commercially available.

SUMMARY OF THE INVENTION

The invention concerns a method for forming a transformer in a ceramic substrate. The method can include the steps of forming at least one conductive coil comprising a plurality of turns about an unfired ceramic toroidal core region defined within an unfired ceramic substrate. The method can also include the step of co-firing the unfired ceramic toroidal core region, the unfired ceramic substrate, and the conductive coil to form an integral ceramic substrate structure with the conductive coil at least partially embedded therein.

According to one aspect, the method can include the step of forming at least a portion of the ceramic toroidal core region of a ceramic material having a permeability greater than one. The method can also include the step of disposing a conductive ground plane layer between the conductive coil and an outer surface of the ceramic substrate. For example, the ground plane layer can be disposed between the conductive coil and at least one surface mount component disposed on a surface of the ceramic substrate.

The method can also include the step of forming a second conductive coil including a plurality of turns disposed about the ceramic toroidal core. According to one aspect of the invention, the coil radius of the second conductive coil can be chosen to be different from a coil radius of the first conductive coil. According to another aspect of the invention the method can include the step of forming a second conductive coil of a plurality of turns disposed about a radial portion of the ceramic toroidal core exclusive of the radial portion of the ceramic toroidal core where the first conductive coil is disposed. Further, the conductive coil can be formed with at least one output tap along its radius to form an autotransformer.

According to another aspect, the invention can comprise a transformer embedded in an LTCC substrate. In that case, the invention can include a ceramic substrate, a ceramic toroidal core embedded within the ceramic substrate, and at least one conductive coil comprising a plurality of turns about the ceramic toroidal core. Subsequently, the ceramic toroidal core can be integrally formed with the ceramic substrate in a co-firing process. At least a portion of the ceramic toroidal core can have a permeability greater than one.

According to one aspect of the invention, the plurality of turns can be contained within the ceramic substrate at all points. According to another aspect of the invention, the ceramic toroidal core can be comprised of a ceramic material that has a permeability greater than a second ceramic material comprising at least one other portion of the ceramic substrate. Further, at least one conductive metal ground plane layer can be disposed within the ceramic substrate. For example, the ground plane layer can be interposed between the conductive coil and at least one surface mount component disposed on a surface of the ceramic substrate.

The transformer can also include a second conductive coil formed of a plurality of turns disposed about the ceramic toroidal core and having a coil radius different from the first conductive coil. According to one aspect of the invention, a second conductive coil formed of a plurality of turns can be disposed about a radial portion of the ceramic toroidal core exclusive of a second radial portion of the ceramic toroidal core where the first conductive coil is disposed. Alternatively, the transformer as disclosed herein can be formed as an autotransformer.

DETAILED DESCRIPTION OF THE PREFERRED EMBODIMENTS

The invention concerns a toroidal transformer integrated within a ceramic substrate and a method of making same. The method shall be described in reference to FIGS. 1–4, and the flowchart in FIG. 5. The method can begin with step 502 by forming a suitably sized piece of unfired ceramic tape 100. The ceramic tape 100 can be any of a variety of commercially available glass ceramic substrates designed to be calcined at about 800° C. to 1,050° C. This class of materials is commonly referred to as low-temperature co-fired ceramics (LTCC). Such LTCC materials have a number of advantages that make them especially useful as substrates for RF systems. For example, low temperature 951 co-fire Green TapeTM from Dupont® is Au and Ag compatible, and it has a thermal coefficient of expansion (TCE) and relative strength that are suitable for many applications. Other similar types of ceramic tapes can also be used. The size of the ceramic tape can be determined by a variety of factors depending upon the particular application. For example, if the toroidal transformer is to form part of a larger RF circuit, the ceramic tape can be sized to accommodate the RF circuit in which the toroidal transformer forms a component.

Figure 1:
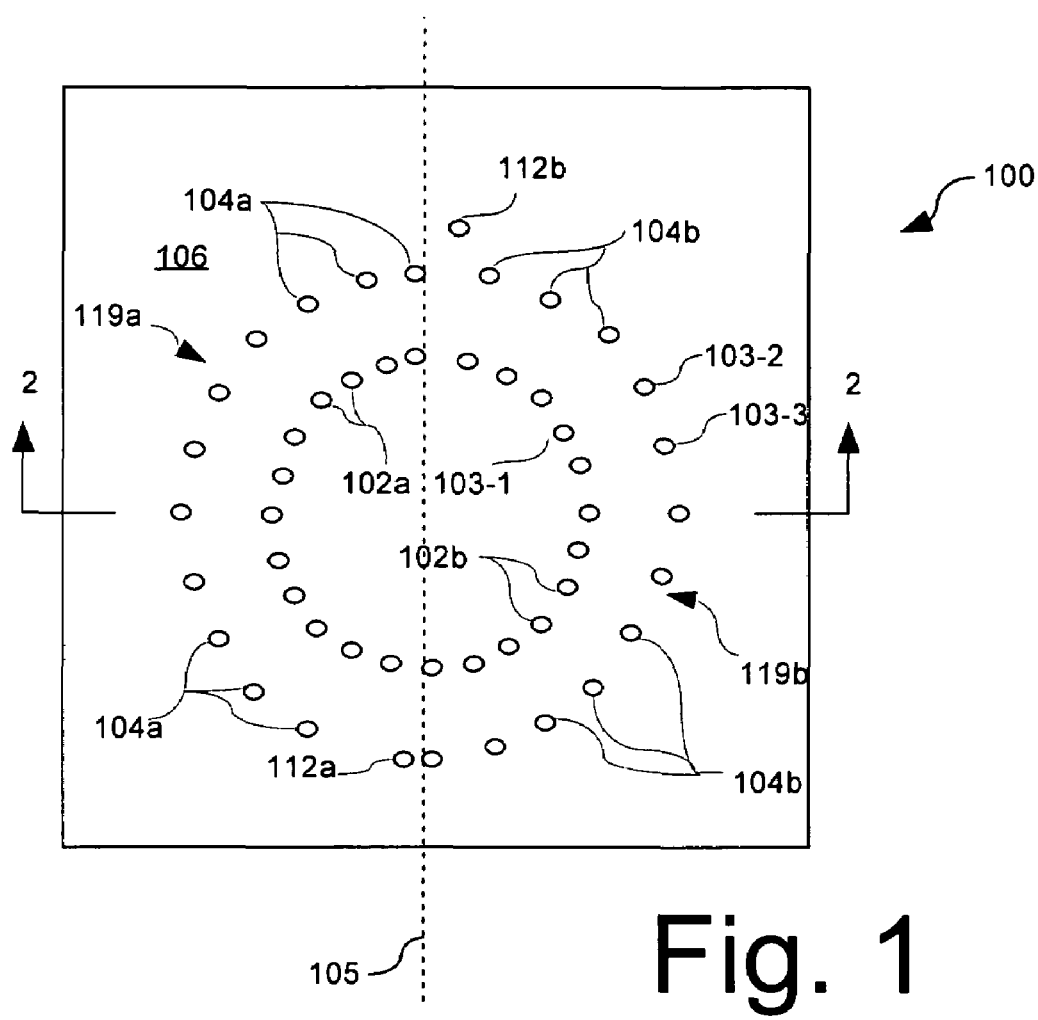
FIG. 1 a is top view of a ceramic substrate with vias formed therein that is useful for understanding the method of forming a toroidal transformer.
Figure 2:
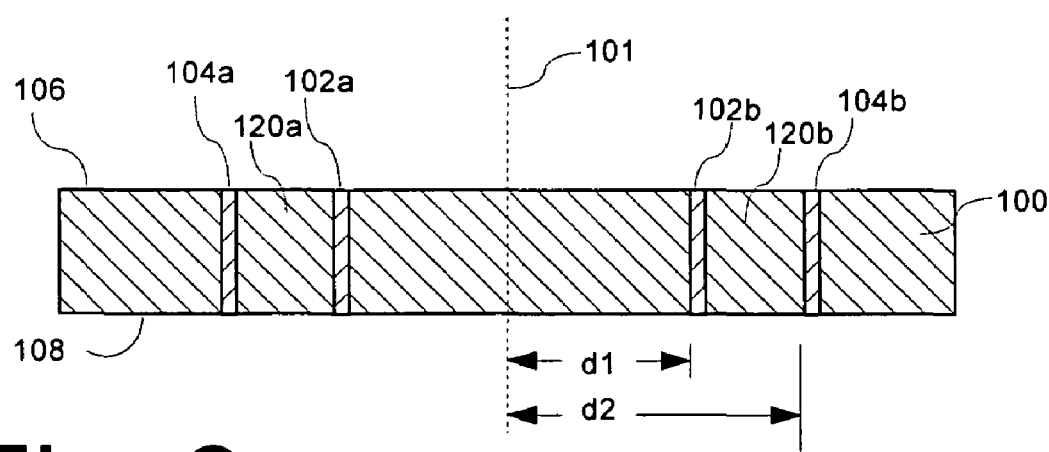
FIG. 2 is a cross-sectional view of the substrate of FIG. 1, taken along lines 2—2.

Referring to FIGS. 1 and 2, a first plurality of conductive vias 102a, 102b can be formed in the unfired ceramic tape 100. In FIG. 1, the plurality of conductive vias 102a, 102b are each arrayed around an arc of approximately 180 degrees, on either side of line 105. Thus, each set of conductive vias roughly defines a half circle. However, the invention is not limited in this regard. Instead, the conductive vias 102a or 102b can be each be arrayed around an arc that is greater or less than 180 degrees, provided that the combination of the arcs formed by each set of conductive vias 102a and 102b cumulatively define an arc of roughly 360 degrees as shown.

The conductive vias can be formed using conventional techniques, which include punching holes in the unfired ceramic tape 100 in step 504 and filling the via holes in step 508 with conductive paste. As shown in FIGS. 1 and 2, the first plurality of conductive vias 102a, 102b can be radially spaced a first distance dl from a central axis 101 so as to define an inner circumference of a toroidal transformer. In steps 506 and 508, a second plurality of conductive vias 104a, 104b can be similarly formed radially spaced a second distance d2 about the central axis so as to define an outer circumference. In FIG. 1, the plurality of conductive vias 104a, 104b are each arrayed around an arc of approximately 180 degrees corresponding to the arc defined by conductive vias 102a, 102b. However, the invention is not limited in this regard. Instead, the conductive vias 104a or 104b can be each be arrayed around an arc that is greater or less than 180 degrees, provided that the arcs are respectively consistent with those formed by conductive vias 102a, 102b. As shown in FIG. 2, the vias can extend substantially between opposing surfaces 106, 108 of the ceramic tape 100.

Figure 3:
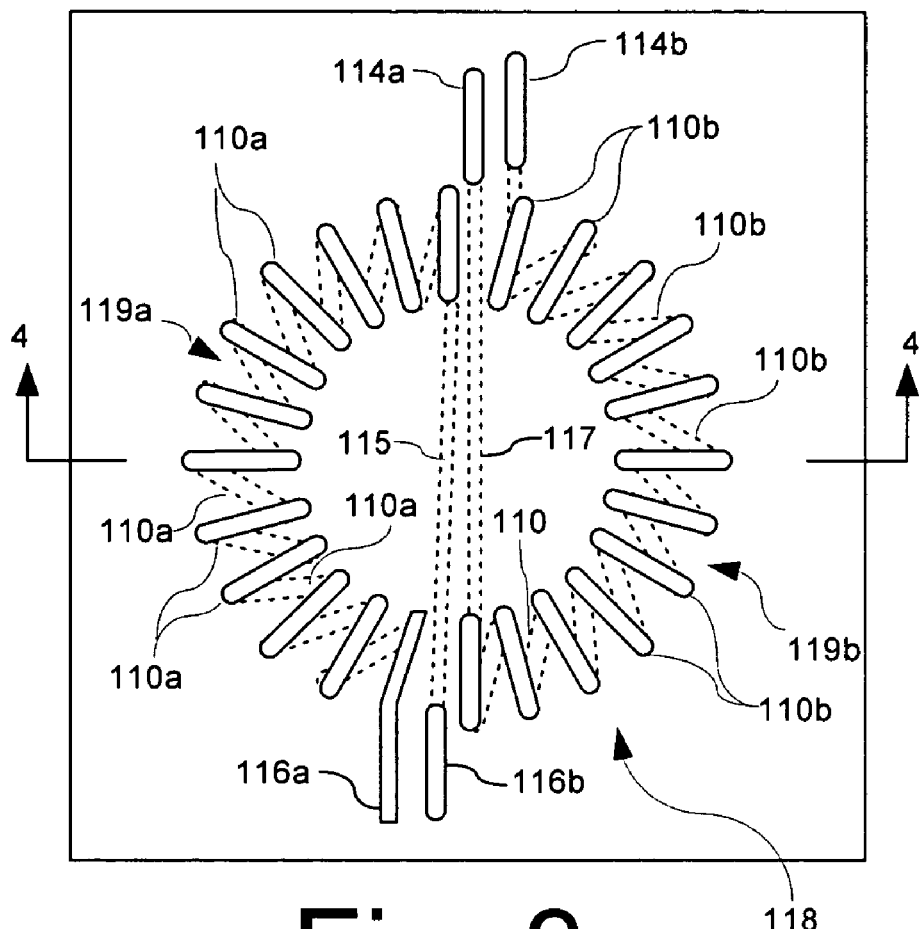
FIG. 3 is a top view of the substrate in FIG. 1, after conductive traces and a second layer has been added to form a toroidal transformer.
Figure 4A:
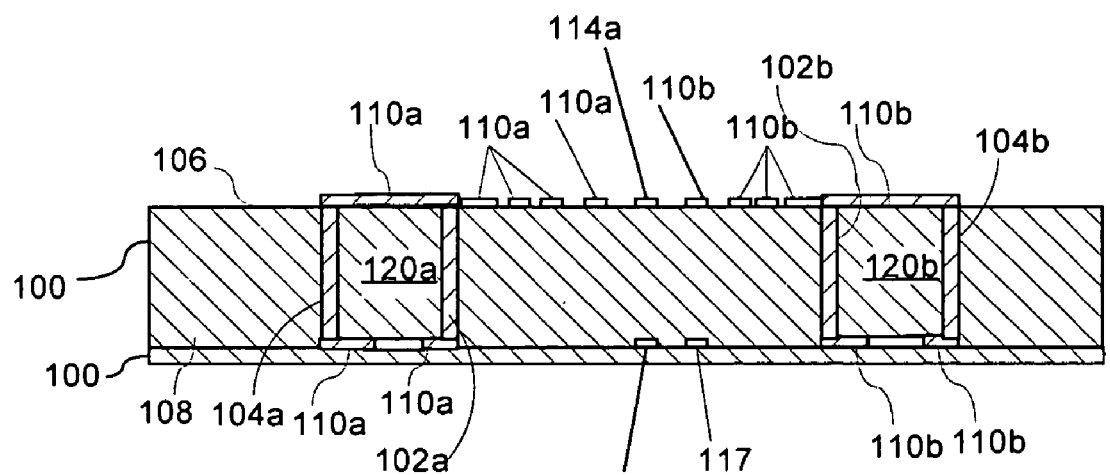
FIG. 4A is a cross-sectional view of the substrate in FIG. 3, taken along lines 4—4.
Figure 5:
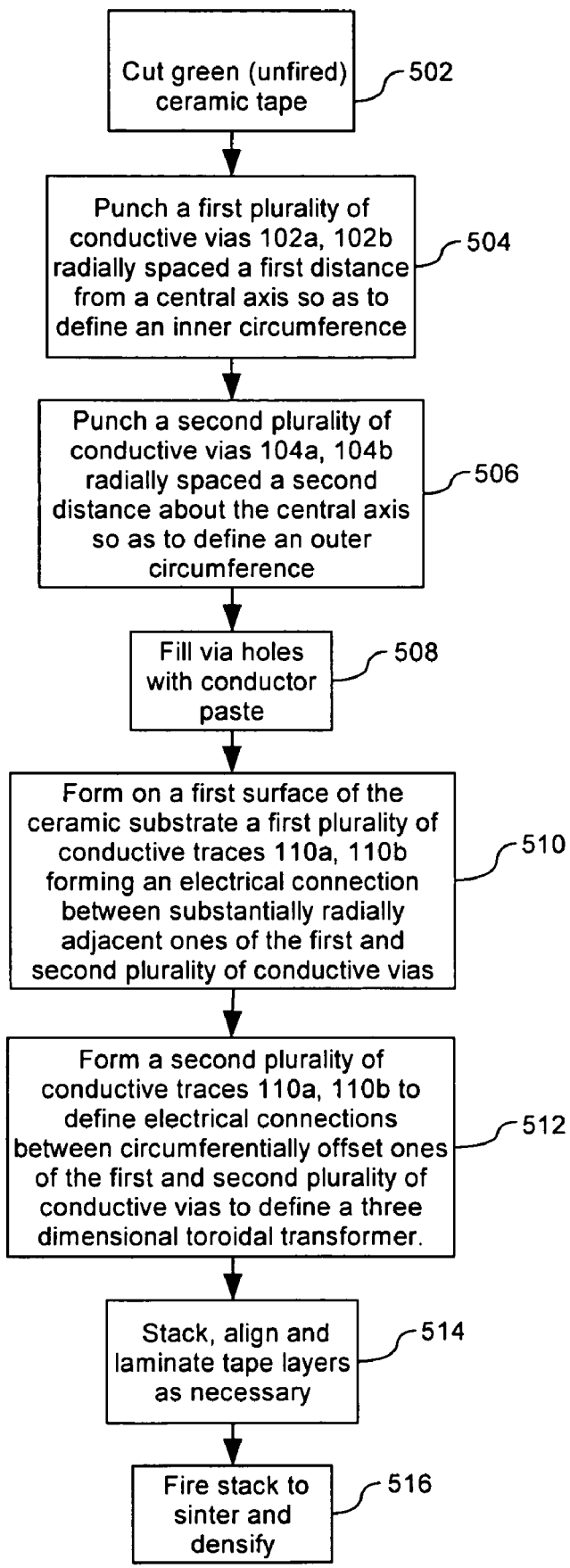
FIG. 5 is a flow chart that is useful for understanding the method of making the present invention.

Referring now to FIGS. 3 and 4A, the process can continue in step 510 by disposing a plurality of conductive traces 110a, 110b on ceramic tape 100. The conductive traces 110a on surface 106 form electrical connections between respective ones of the first and second plurality of conductive vias 102a, 104a that are substantially radially adjacent. Similarly, conductive traces 110b on surface 106 form electrical connections between respective ones of the first and second plurality of conductive vias 102b, 104b that are substantially radially adjacent.

In step 512, a second plurality of conductive traces 110a, 110b is provided on surface 108 of a second ceramic tape 100. The second ceramic tape 100 can also be formed of an LTCC material. The second plurality of conductive traces 110a, 110b is arranged so that when the two ceramic tape layers are aligned and stacked as shown, the traces 110a on surface 108 will provide an electrical connection between circumferentially offset ones of the first and second pluralities of conductive vias 102a, 104a. Similarly, traces 110b will provide an electrical connection between circumferentially offset ones of conductive vias 102b, 104b as shown.

The conductive traces 110a, 110b can be formed of any suitable conductive paste or ink that is compatible with the co-firing process for the selected LTCC material. Such materials are commercially available from a variety of sources. Further, it should be noted that for the purposes of consistency with standard LTCC processing, two layers of ceramic tape 100 are shown in FIG. 4A with traces 110a, 110b disposed on one side of each tape only. However, the invention is not so limited. Those skilled in the art will appreciate that it is possible for traces 110a, 110b to instead be disposed on opposing sides of a single layer of ceramic tape 100 and such alternative arrangements are intended to be within the scope of the invention. In step 514, the various LTCC layers 100 can be stacked and aligned with one another utilizing conventional processing techniques.

The conductive vias 102a, 104a, and the conductive traces 110a and 115 together define a first winding 119a of a three dimensional transformer 118. Likewise, conductive vias 102b, 104b and conductive traces 110b and 117 define a second winding 119b of the three dimensional transformer 118. In this regard, it should be understood that the invention herein is not limited to the precise arrangement or pattern of vias 102a, 102b, 104a, 104b and traces 110a, 110b, 115, 117 that are illustrated in FIGS. 1–4A. Instead, any pattern of vias and traces formed in the ceramic tape layer can be used provided that it generally results in a substantially toroidal transformer arrangement, it being understood that many minor variations are possible.

For example, it is stated above that the conductive traces 110a, 110b on surface 106 form electrical connections between respective ones of the first and second plurality of conductive vias that are substantially radially adjacent. Vias 103-1 and 103-2 are examples of radially adjacent vias. However, it should be noted that radially adjacent conductive vias, as that term is used herein, are not necessarily precisely aligned radially. Such radially adjacent vias can also include vias that are offset circumferentially from one another to some degree. Vias 103-1 and 103-3 represent circumferentially offset vias. As can be seen in FIG. 1, circumferentially offset vias are not aligned radially. The invention is not intended to be limited to any specific geometry of conductive traces 110a, 110b, 115, 117 and vias 102a, 102b, 104a, 104b, provided that the combination of these elements defines at least a radial part of a continuous toroidal transformer.

Referring to FIGS. 1 and 3, one or more additional vias 112a, 112b and additional traces 114a, 114b, 116a, 116b can be provided to define first and sets of electrical contacts for the toroidal transformer defining a first winding 119a and second winding 119b. Notably, it can be desirable for the first winding 119a to have a different number of turns as compared to the second winding 119b and the invention is not limited to any particular number of turns for either coil. Once all of the vias 102a, 102b, 104a, 104b, 112a, 112b and traces 110a, 110b, 115, 117, 114a, 114b, 116a, 116b are completed, the ceramic tapes 100, vias and traces can be fired together in step 516 in accordance with a temperature and time appropriate for the particular type of ceramic tape.

The process can also include the step of forming at least a toroid shaped core region 120a, 120b within the ceramic tape 100 that has at least one electrical characteristic different from at least one other portion of the ceramic substrate. For example, the electrical characteristic can be permeability or permittivity. Advantageously, the permeability of at least the toroid shaped core region can be increased by forming at least a portion of the core region 120a, 120b of a low-temperature co-fired ceramic (LTCC) material that has a permeability greater than one. According to a preferred embodiment, at least the core region can have a permeability substantially greater than one. For example, the permeability in the core region, using current technology, can range from about 150 to 400. However, the invention is not limited in this regard. Instead, high permeability can include values greater than about 1.0.

Figure 4B:
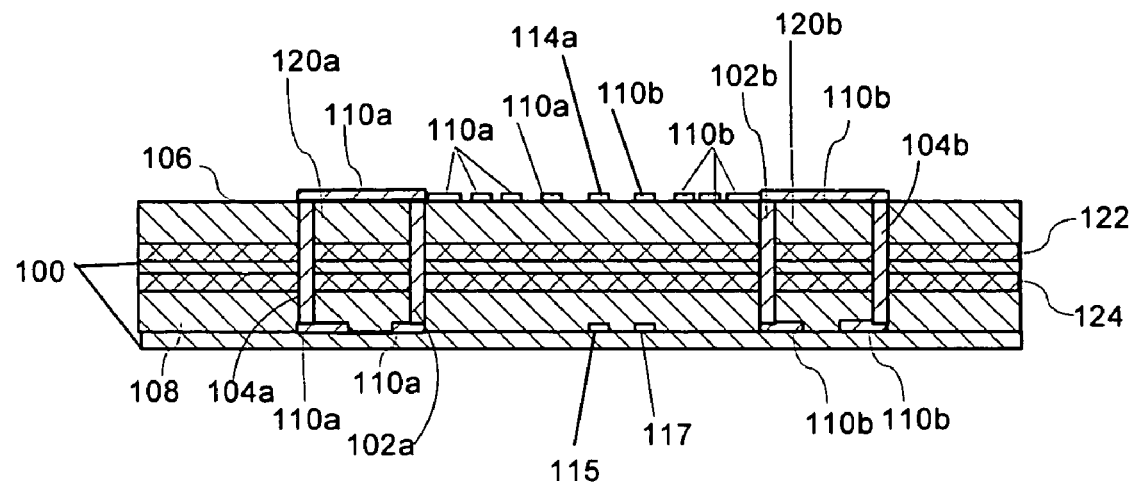
FIG. 4B is a cross-sectional view of a first alternative embodiment of the toroidal transformer in FIG. 4A.

The high permeability core region can be formed by any suitable means. For example, the high permeability core region can be formed by stacking one or more layers of unfired high permeability ceramic tape in conjunction with traditional non-ferrous ceramic tape having a permeability of one as shown in FIG. 4B. The high permeability layers are advantageously arranged to intersect the core region. In an alternative embodiment, the substrate can also be formed so that the high permeability region exclusively includes the core region. Other LTCC tape layers not coincident with the core region can also be formed of high permeability material. For example, all of the layers could be formed from high permeability LTCC tape layers.

As illustrated in FIG. 4B, the unfired ceramic tapes 122, 124 can be stacked together with a plurality of unfired ceramic tape layers 100. According to one embodiment, ceramic tapes 122, 124 can have a higher relative permeability as compared to ceramic tape layers 100. The unfired tape layers 122, 124 can be positioned to ensure that at least a portion of them will be contained in the core region 120. Unfired tape layers 122, 124 can be any ceramic tape compatible with the remaining tape layers 100 in the stack. For example a high permeability LTCC tape is commercially available from Electro-Science Laboratories, Inc., of 416 East Church Road, King of Prussia, Pa. 19406-2625, USA. In particular, reference is made to product number ESL 40010 that has a permeability of 150–400. According to an alternative embodiment, all of the tape layers can be formed of high permeability material.

Figure 4C:
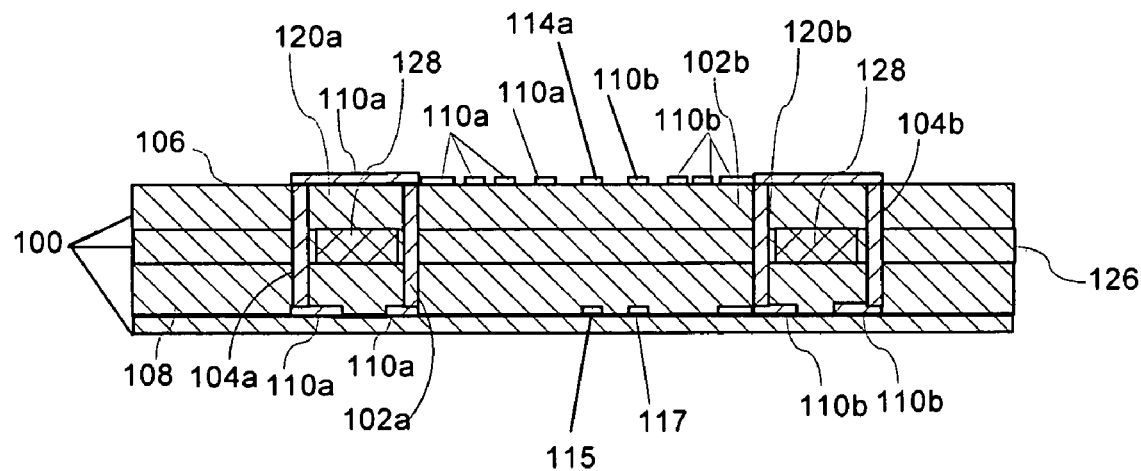
FIG. 4C is a cross-sectional view of a second alternative embodiment of the toroidal transformer in FIG. 4A.
Figure 4D:
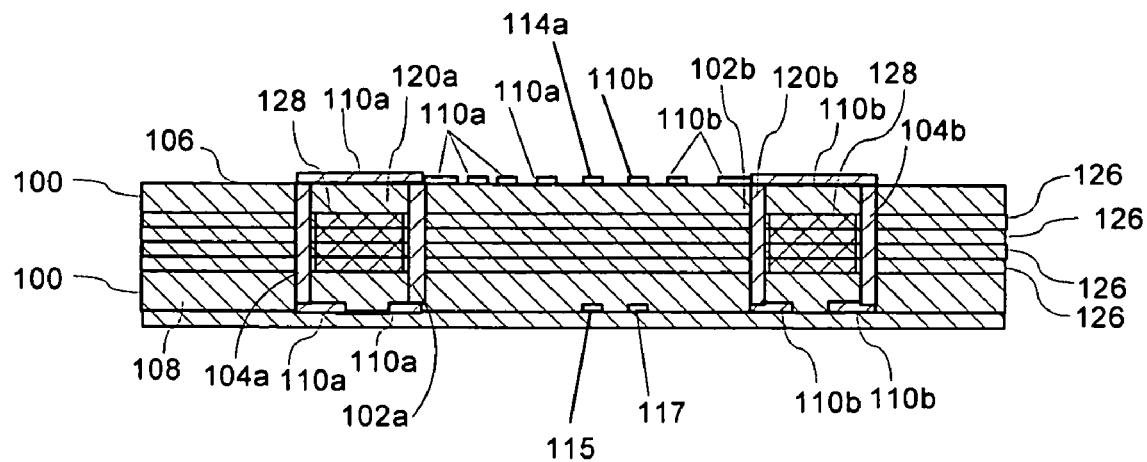
FIG. 4D is a cross-sectional view of a third alternative embodiment of the toroidal transformer in FIG. 4A.

FIG. 4C illustrates an arrangement in which an unfired ceramic tape layer 126 is combined with a plurality of unfired tape layers 100. Further, tape layer 126 can include portions 128 intersecting the core region 120. Portions 128 can have a higher permeability as compared to the remainder of tape 126 and tapes 100. FIG. 4D illustrates a similar arrangement where a plurality of unfired tape layers 126 are stacked with unfired tape layers 100 as shown.

Figure 4E:
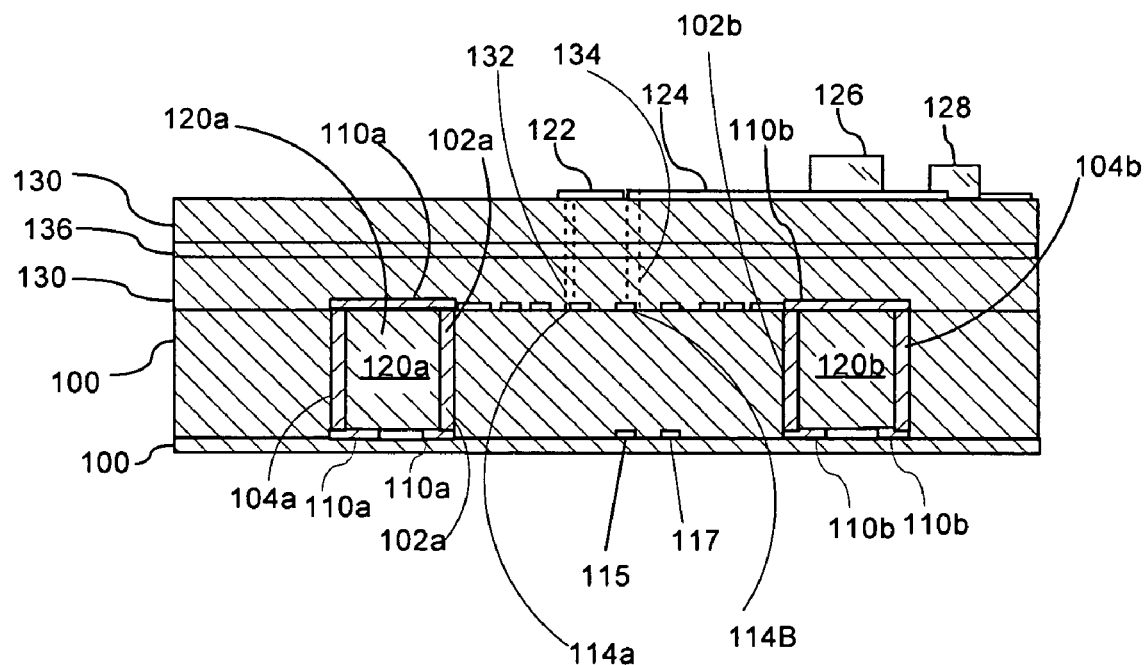
FIG. 4E is a cross-sectional view of a fourth alternative embodiment of the toroidal transformer in FIG. 4A in which additional layers have been added.

In many instances, it can be advantageous to make use of the surface area above and/or below the toroidal transformer for the placement of circuit traces or other surface mount components. The addition of one or more additional LTCC layers over the traces 110a, 110b can facilitate such placement. FIG. 4E shows the torroidal transformer in FIG. 4E with additional LTCC layers 130 disposed thereon to completely embed the transformer within the stack. Vias 132, 134 can provide electrical connections to traces 114a, 114b of the toroidal transformer. Similar vias, not shown can be provided for traces 116a, 116b. Circuit traces 122, 124 and circuit components 126, 128 can be placed on the outer surface of the stack as shown. Notably, although the components in FIG. 4E are shown on only one side of the torroidal transformer, the invention is not so limited.

In the case of RF circuit boards, it is often important to maintain a predetermined spacing between conductive traces and a ground plane. This is particularly important where the conductive traces define RF transmission lines, such as micro-strip transmission lines. The presence of the conductive traces 110a, 110b, vias 102a, 102b, 104a, 104b, and any high permeability ceramic substrates, can create undesirable variations in the characteristic impedance of the line. Accordingly, it can be desirable, although not necessary, to provide at least one conductive layer 136 spaced beneath an outer one of the ceramic tape layers 130.

The conductive layer 136 can define a ground plane that can isolate the various sub-surface structures from the surface mount components and transmission lines. If a conductive layer 136 is provided, suitable openings can be formed to avoid any electrical contact with conductive vias 132, 134. Notably, the toroid transformer maintains most of the magnetic field inside the structure. Accordingly, it is not generally necessary to shield surface components (or other electrical traces) from the toroid. The exception would be electrical traces that define RF transmission lines. In that case, the characteristic impedance of the line can be altered by the presence of discontinuities in the substrate. Further, the high permeability layers used to form the substrate for the toroid may not be suitable substrates for the RF transmission lines. In that case, a ground plane layer can serve to isolate the high permeability layers from the RF transmission line and associated substrate. Another advantage of the toroid transformer structure as compared to couple planar spiral transformer arrangements is that in those instances where a trace needs a ground plane beneath it (i.e. microstrip) the ground plane can be placed anywhere near the toroid without affecting the inductance. In contrast, a ground plane near a planar spiral transformer can significantly alter its operational parameters.

As will be apparent from the foregoing, the invention can in one embodiment be comprised of a printed circuit board formed of an LTCC ceramic substrate and a ceramic toroidal core region embedded within the ceramic substrate. The conductive metal coils forming the transformer can be comprised of a plurality of turns about the ceramic toroidal core as shown in FIG. 3. The conductive metal coil can be a toroidal inductor defined by the conductive vias 110a, 110b and traces 102a, 102b, 104a, 104b. The ceramic toroidal core region can be integrally formed with the ceramic substrate as a result of a co-firing process of the ceramic layers, e.g ceramic tapes layer 100, 130. As noted above, the ceramic toroidal core region can be comprised of a ceramic material that has a permeability greater than a second ceramic material comprising at least one other portion of the ceramic substrate.

Figure 6:
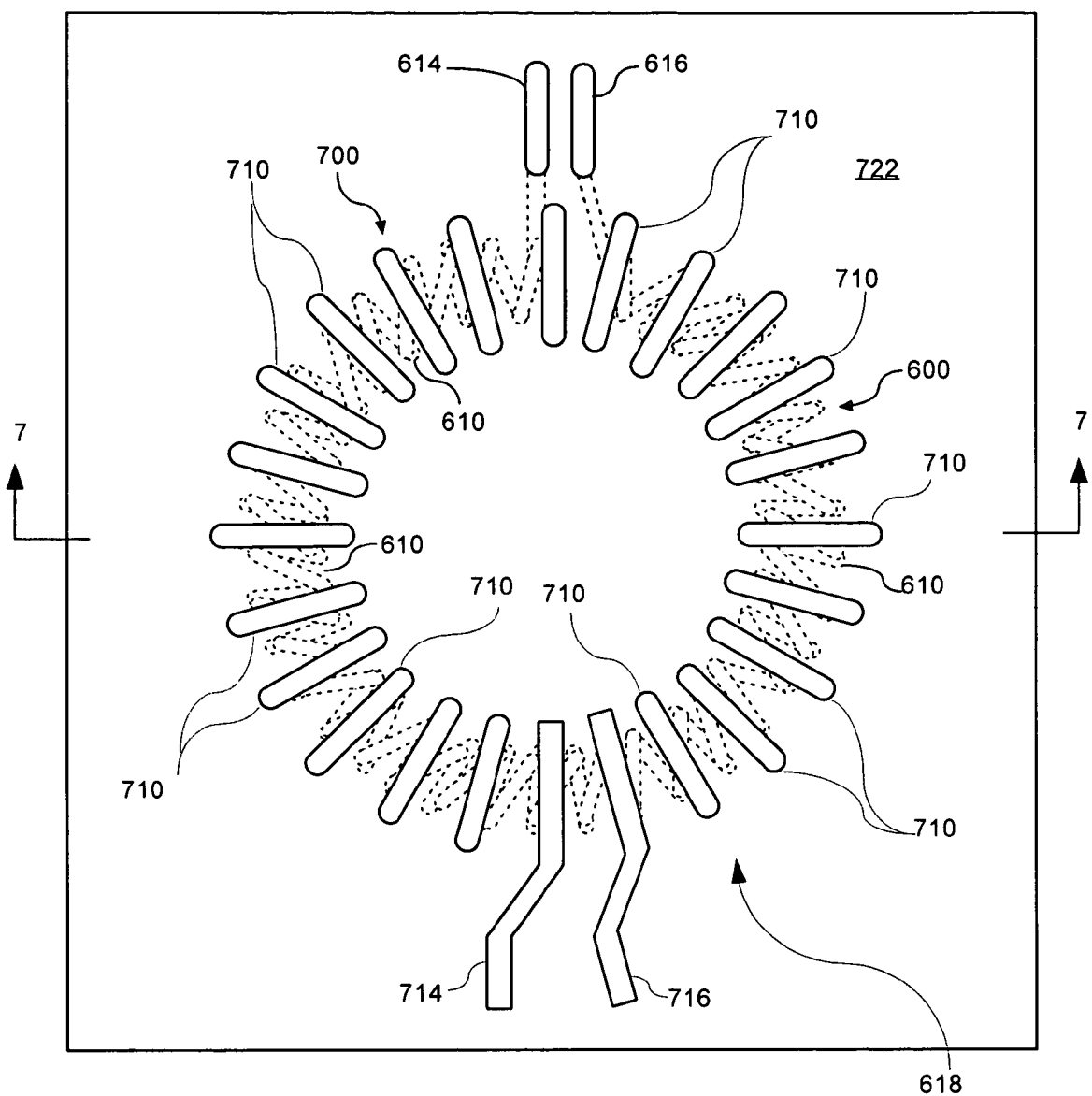
FIG. 6 is a top view of a toroidal transformer illustrating an alternative inventive arrangement.
Figure 7:
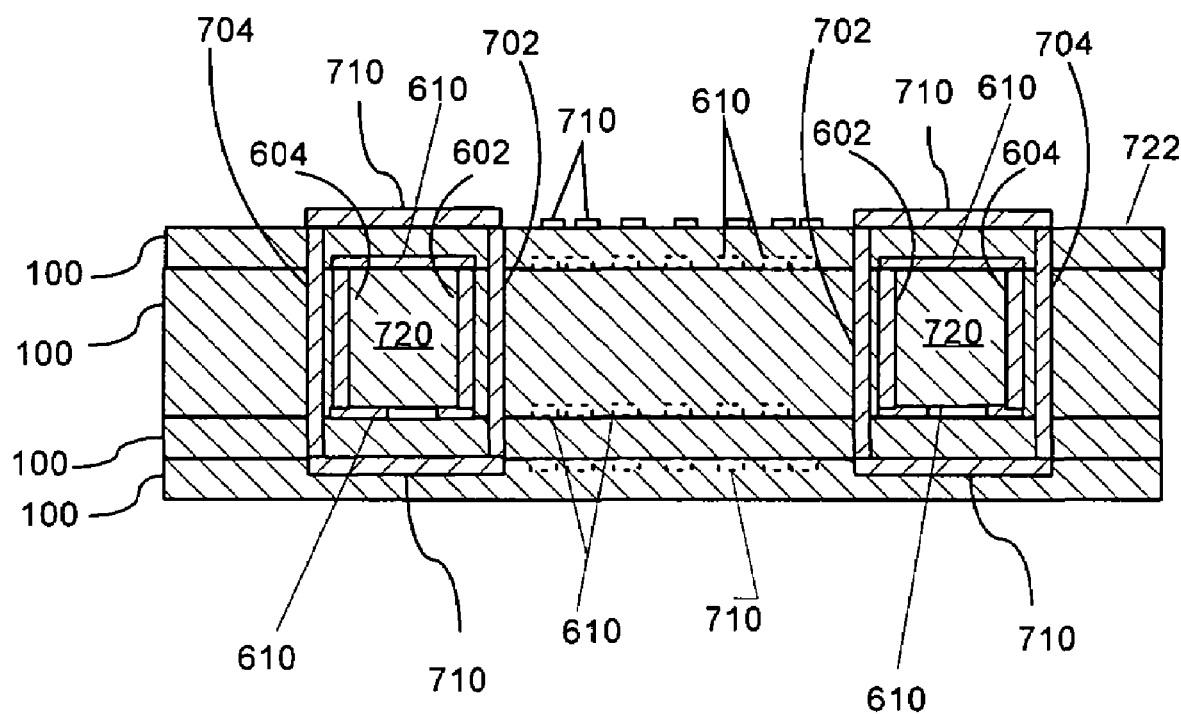
FIG. 7 is a cross-sectional view of the toroidal transformer in FIG. 6, taken along lines 7—7.

The foregoing techniques can be utilized to construct alternative types of toroidal transformers. Referring now to FIGS. 6 and 7, there is shown a toroidal transformer 618 in accordance with an alternative embodiment of the invention. A first toroidal winding 600 is comprised of vias 602, 604, and traces 610 that can be formed using the process described relative to FIGS. 1–4. The single toroidal winding 600 can extend continuously around an arc of about 360 degrees as shown, but can also be limited to an arc of lesser angle. This is to be distinguished from the first and second windings 119a and 119b in FIGS. 1–4 which each formed only a portion of the 360 degree arc. Terminals 614, 616 can be formed to provide electrical contacts with the toroidal winding 600. Vias (not shown) can form an electrical connection between the terminals 614, 616 and the toroidal winding 600.

A second toroidal winding 700 comprised of vias 702, 704 and traces 710 is formed using techniques similar to those described relative to FIGS. 1–4. For purposes of clarity, traces 710 on a bottom side of the substrate are not shown in FIG. 6. The single toroidal winding 700 can extend continuously around an arc of about 360 degrees as shown, but can also be limited to an arc of lesser angle. Terminals 714, 716 provide electrical contacts with the toroidal winding 700. The second toroidal winding 700 has a larger coil diameter and is coaxial with the first toroidal winding 600 so that the two winding share a common toroidal core 720. The windings 600, 700, formed as shown, form a toroidal transformer 618. The ratio of the number of coils in each winding 600,700 will determine the voltage transforming properties of the transformer 618 and can be selected for the particular transformer application. Additional winding layers can also be provided using the techniques described herein.

In FIGS. 6 and 7, the traces 710 disposed on the surface 722 are exposed and may therefore interfere with the placement of surface mount components or other prevent the positioning thereon of other signal traces forming part of the circuit. Accordingly, it can be desirable to add one or more additional LTCC layers and/or ground plane layers to the stack in FIG. 7 over surface 722. For the purposes of clarity, these layers have been omitted from FIG. 7. However, such layers can be similar to the additional layers 130, 136 as described relative to FIG. 4E. Similarly, one or more layers 100 in the stack of LTCC layers forming the toroidal transformer 618 can include LTCC layers of high permeability as previously described.

Figure 8:
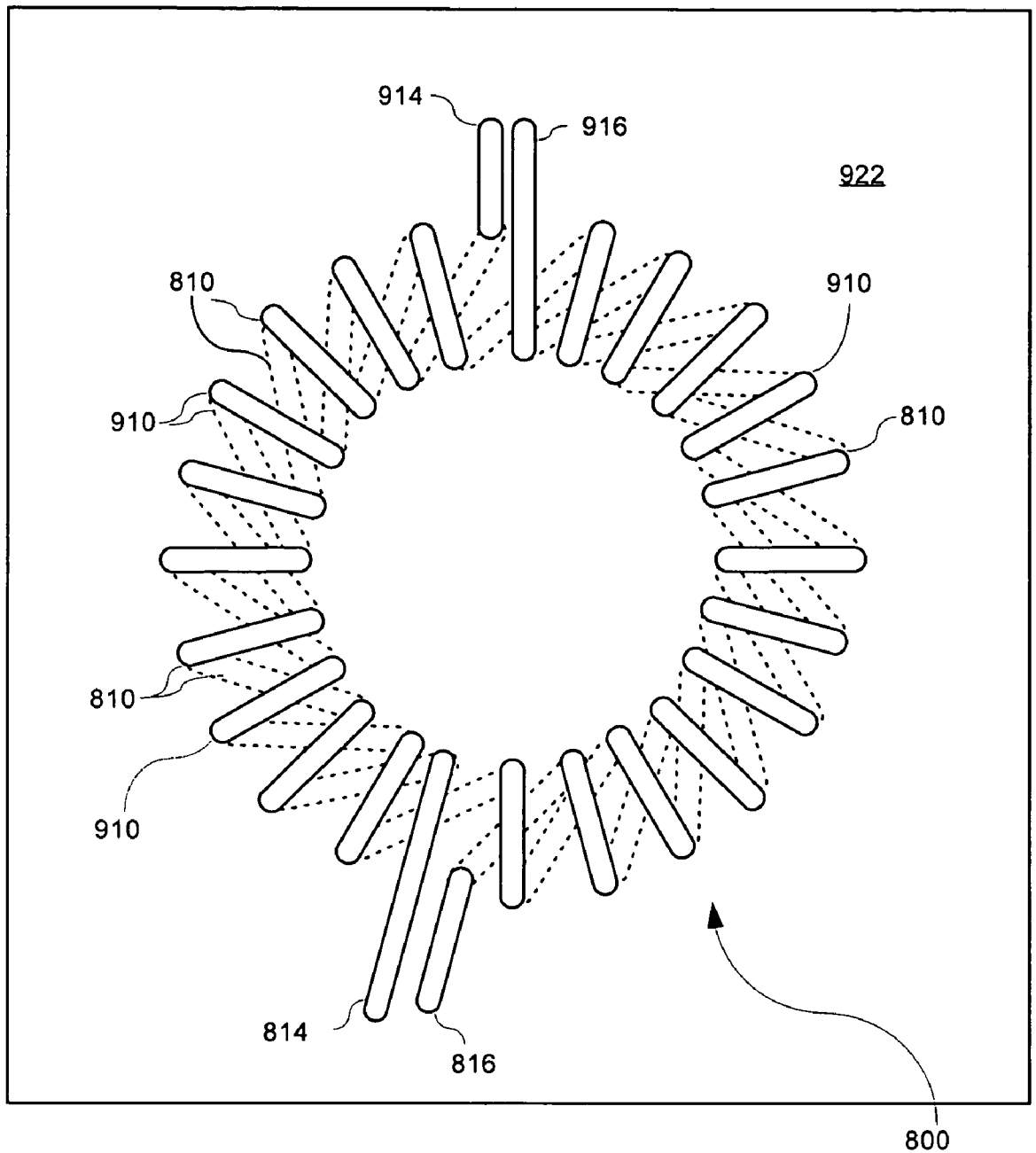
FIG. 8 is a top view of a toroidal transformer with intertwined windings.

Yet another embodiment of the invention is illustrated in FIG. 8. The toroidal transformer in FIG. 8 can be formed using the same techniques as described herein relative to FIGS. 1–7. However, in this embodiment, the first and second windings 810, 910 are intertwined as shown. Terminals 814 and 816 provide electrical contacts with the toroidal winding 800, while terminals 914 and 916 provide electrical contacts with the toroidal winding 900. As described above relative to FIGS. 1–4, it can be desirable to add one or more additional LTCC layers and/or ground plane layers to the stack in FIGS. 7 and 8 over surface 922. For the purposes of clarity, these layers have been omitted from FIGS. 7 and 8. However, such layers can be similar to the additional layers 130, 136 as described relative to FIG. 4E. Similarly, one or more layers 100 in the stack of LTCC layers forming the toroidal transformer 800 can include LTCC layers of high permeability as previously described so as to define a high permeability core region.

Figure 9:
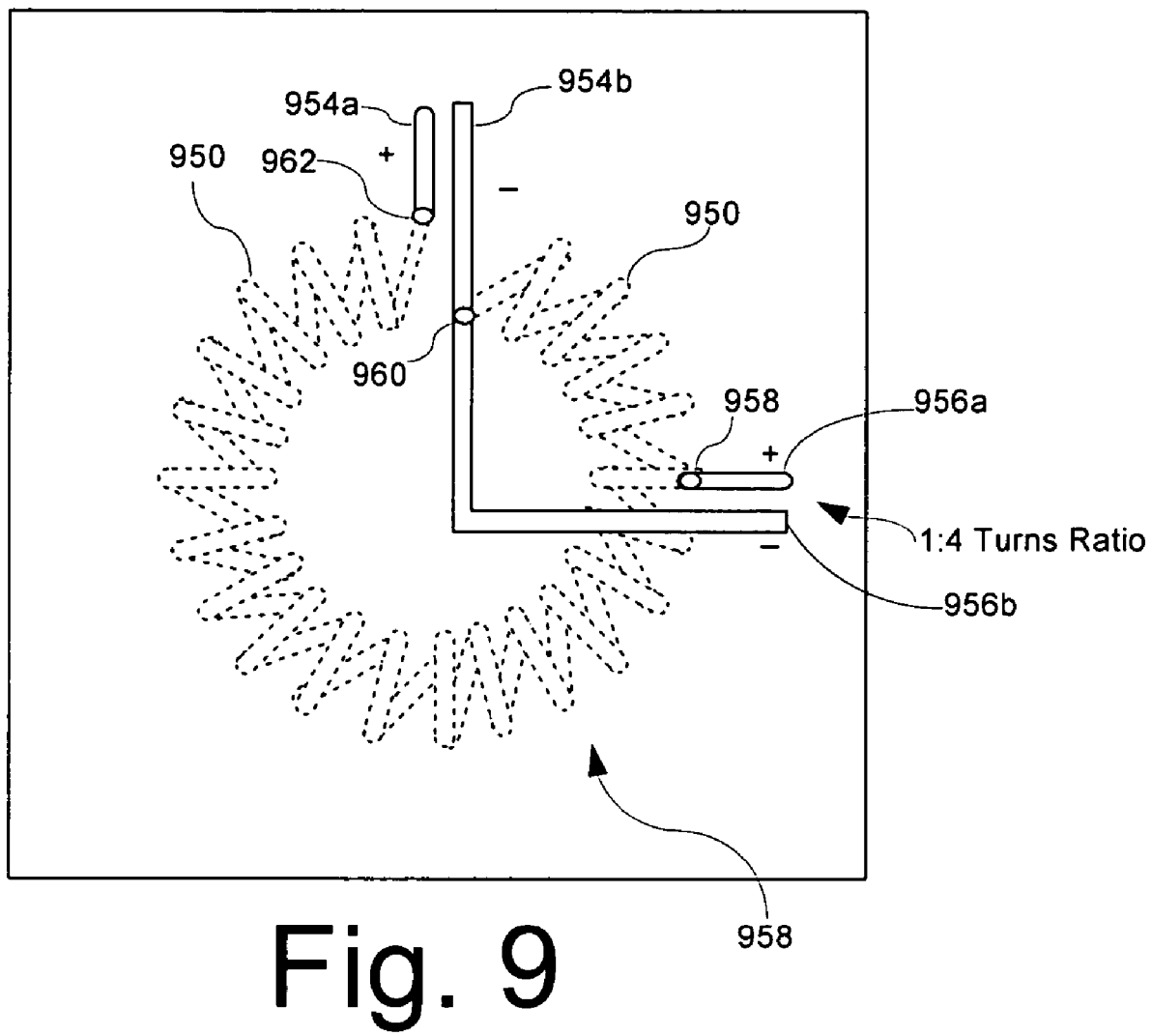
FIG. 9 is a top view of a toroidal transformer configured as an autotransformer.

Yet another embodiment of the invention is illustrated in FIG. 9. FIG. 9 is a DC pass type autotransformer. The autotransformer in FIG. 9 can be comprised of a single toroidal winding that is embedded within an LTCC substrate. The single toroidal winding 950 can be formed using manufacturing techniques similar to those described herein with regard to FIGS. 1–8. However, rather than using multiple windings to transform from one voltage to another, one or more taps are placed at selected locations along its radius. Autotransformers are known to those familiar with the art. However, by making use of the inventive methods described herein, a toroidal type autotransformer 958 can be embedded within the LTCC substrate. In FIG. 9, contacts 954*a*, 954*b* are electrically connected by means of vias 960, 962 to the toroidal winding 950. At least one tap 956*a* is connected by means of via 958 to the toroidal winding 950 at a selected location along it radius. The voltage transformer ratio will be determined by the ratio of total turns in the toroidal winding to the number of turns between the input 954*b* and output tap 956*a*. For example, the turns ratio of the autotransformer in FIG. 9 is about 1:4.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as described in the claims.

We claim:

1. A transformer embedded in an LTCC substrate, comprising:
    a ceramic substrate comprised of a plurality of ceramic tape layers;
    at least a first one of said ceramic tape layers layered between a plurality of second ceramic tape layers, said first ceramic tape layer having a larger permeability value as compared to said second ceramic tape layers; and
    at least one conductive coil disposed within said plurality of ceramic tape layers, said conductive coil in the shape of a toroid having a central axis oriented transverse to said tape layers, and comprising a plurality of turns about a region which defines a ceramic toroidal core, wherein said ceramic toroidal core is intersected by said first ceramic tape layer.

2. The transformer according to claim 1 wherein said plurality of turns is contained within said ceramic substrate at all points.

3. The transformer according to claim 1 further comprising at least one conductive metal ground plane layer disposed within said ceramic substrate.

4. The transformer according to claim 1 further comprising a second conductive coil including a plurality of turns disposed about said ceramic toroidal core and having a coil radius different from said first conductive coil, and wherein a toroidal core of said second conductive coil is also intersected by said first ceramic tape lever.

5. The transformer according to claim 1 wherein said transformer is an autotransformer.

6. The transformer according to claim 1 wherein at least a portion of said ceramic toroidal core region has a permeability greater than one.

7. A transformer embedded in an LTCC substrate, comprising:
    a ceramic substrate comprised of a plurality of ceramic tape layers;
    at least a first one of said ceramic tape layers layered between a plurality of second ceramic tape layers, said first ceramic tape layer having a larger permeability value as compared to said second ceramic tape layers;
    at least one conductive coil formed in the shape of a toroid having a central axis oriented transverse to said tape layers, and comprising a plurality of turns about a region which defines a ceramic toroidal core, wherein said ceramic toroidal core is intersected by said first ceramic tape layer ; and
    at least one conductive metal ground plane layer disposed within said ceramic substrate, wherein said conductive metal ground plane layer is interposed between said conductive coil and at least one surface mount component disposed on an outer surface of said ceramic substrate.

8. A method for forming a transformer in a ceramic substrate, comprising the steps of:
    forming an unfired ceramic substrate comprised of a plurality of ceramic tape layers;
    positioning at least a first one of said ceramic tape layers at a location layered between a plurality of second ceramic tape layers;
    selecting a permeability of said first ceramic tape layer to be a larger value as compared to said second ceramic tape layers;
    forming at least one conductive coil formed in the shape of a toroid having a central axis oriented transverse to said tape layers, and comprising a plurality of turns about a toroidal core region;
    co-firing said plurality of tape layers comprising said unfired ceramic substrate, and said conductive coil to form an integral ceramic substrate structure with said conductive coil at least partially embedded therein; and
    disposing a conductive ground plane layer between said conductive coil and at least one surface mount component disposed on an outer surface of said ceramic substrate.

9. A method for forming a transformer in a ceramic substrate, comprising the steps of:
    forming an unfired ceramic substrate comprised of a plurality of ceramic tape layers;
    positioning at least a first one of said ceramic tape layers at a location layered between a plurality of second ceramic tape layers;
    selecting a permeability of said first ceramic tape layer to be a larger value as compared to said second ceramic tape layers;
    forming a plurality of vias and traces in said unfired ceramic substrate to define at least one conductive coil formed in the shape of a toroid having a central axis oriented transverse to said tape layers, and comprising a plurality of turns about a toroidal core region;
    co-firing said plurality of tape layers comprising said unfired ceramic substrate and said conductive coil to form an integral ceramic substrate structure with said conductive coil at least partially embedded therein; and
    disposing a conductive ground plane layer between said conductive coil and at least one surface mount component disposed on an outer surface of said ceramic substrate.

10. A method for forming a transformer in a ceramic substrate, comprising the steps of:
    forming an unfired ceramic substrate comprised of a plurality of ceramic tape layers;
    positioning at least a first one of said ceramic tape layers at a location layered between a plurality of second ceramic tape layers;
    selecting a permeability of said first ceramic tape layer to be a larger value as compared to said second ceramic tape layers;

forming at least one conductive coil formed in the shape of a toroid having a central axis oriented transverse to said tape layers, and comprising a plurality of turns about a toroidal core region;

positioning said conductive coil so that it is intersected by said first ceramic tape layer; and co-firing said plurality of tape layers comprising said unfired ceramic substrate, and said conductive coil to form an integral ceramic substrate structure with said conductive coil at least partially embedded therein.

11. The method according to claim 10 further comprising the step of disposing a conductive ground plane layer between said conductive coil and an outer surface of said ceramic substrate.

12. The method according to claim 10 further comprising the step of forming a second conductive coil including a plurality of turns disposed about said ceramic toroidal core.

13. The method according to claim 12 further comprising the step of selecting a coil radius of said second conductive coil to be different from a coil radius of said first conductive coil.

14. The method according to claim 10 further comprising the step of forming a second conductive coil of a plurality of turns disposed about a radial portion of said ceramic toroidal core exclusive of said radial portion of said ceramic toroidal core where said first conductive coil is disposed.

15. The method according to claim 10 further comprising the step of providing at least one tap along a length of said conductive coil to form an autotransformer.

16. A method for forming a transformer in a ceramic substrate, comprising the steps of:

forming an unfired ceramic substrate comprised of a plurality of ceramic tape layers;

positioning at least a first one of said ceramic tape layers at a location layered between a plurality of second ceramic tape layers;

selecting a permeability of said first ceramic tape layer to be a larger value as compared to said second ceramic tape layers;

forming a plurality of vias and traces in said unfired ceramic substrate to define at least one conductive coil formed in the shape of a toroid having a central axis oriented transverse to said tape layers, and comprising a plurality of turns about a toroidal core region;

positioning said conductive coil so that it is intersected by said first ceramic tape layer; and co-firing said plurality of tape layers comprising said unfired ceramic substrate and said conductive coil to form an integral ceramic substrate structure with said conductive coil at least partially embedded therein.

17. The method according to claim 16 further comprising the step of forming said vias from a conductive metal paste.

18. The method according to claim 16, further comprising the step of forming at least a portion of said ceramic toroidal core region of a ceramic material having a permeability greater than one.

19. The method according to claim 16 further comprising the step of disposing a conductive ground plane layer between said conductive coil and an outer surface of said ceramic substrate.

20. The method according to claim 16 further comprising the step of forming a second conductive coil from a plurality of conductive vias and conductive traces to define a plurality of turns disposed about said ceramic toroidal core.

21. The method according to claim 20 further comprising the step of selecting a coil radius of said second conductive coil to be different from a coil radius of said first conductive coil.

22. The method according to claim 16 further comprising the step of forming a second conductive coil of a plurality of turns disposed about a radial portion of said ceramic toroidal core exclusive of said radial portion of said ceramic toroidal core where said first conductive coil is disposed.

23. The method according to claim 16 further comprising the step of providing at least one tap along a length of said conductive coil to form an autotransformer.

* * * * *